(12) United States Patent
Chen et al.

(10) Patent No.: US 7,144,673 B2
(45) Date of Patent: Dec. 5, 2006

(54) EFFECTIVE PHOTORESIST STRIPPING PROCESS FOR HIGH DOSAGE AND HIGH ENERGY ION IMPLANTATION

(75) Inventors: Fei-Yun Chen, Hsin Chu (TW); Jen-Shian Shieh, Hsinchu (TW); Hao-Chih Yuan, Taipei (TW); Yuan-Ko Hwang, Hualien (TW); Shih-Shiung Chen, Chiayi (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 175 days.

(21) Appl. No.: 10/971,268

(22) Filed: Oct. 21, 2004

(65) Prior Publication Data

US 2006/0088784 A1    Apr. 27, 2006

(51) Int. Cl.
*G03F 7/30* (2006.01)
*G03F 7/42* (2006.01)

(52) U.S. Cl. .................. 430/258; 430/329; 430/331

(58) Field of Classification Search .............. 430/258, 430/329, 331
See application file for complete search history.

(56) References Cited

U.S. PATENT DOCUMENTS

| 5,248,912 | A | * | 9/1993 | Zdeblick et al. ............ 310/332 |
| 5,485,644 | A | * | 1/1996 | Shinbara et al. ............ 15/21.1 |
| 5,731,243 | A | | 3/1998 | Peng et al. |
| 5,811,358 | A | | 9/1998 | Tseng et al. |
| 5,882,489 | A | | 3/1999 | Bersin et al. |
| 6,006,764 | A | | 12/1999 | Chu et al. |

* cited by examiner

*Primary Examiner*—Hoa Van Le
(74) *Attorney, Agent, or Firm*—Duane Morris LLP

(57) ABSTRACT

The present subject matter relates to a method of stripping a photoresist after the photoresist film has been subjected to a high dose and high energy ion implant process. The method involves soaking the photoresist film in DI water, dry etching with oxygen plasma, and immersing in Caro's acid solution to improve the throughput of removing the film from the underlying substrate. The method can also be used to strip photoresist that has been hardened or altered by other types of processes such as dry etch transfer steps and chemical treatments. In some applications, the dry etching step may be omitted from the stripping process or the dry etching step may be combined with the water soak in an integrated process.

19 Claims, 2 Drawing Sheets

EFFECTIVE PHOTORESIST STRIPPING PROCESS FOR HIGH DOSAGE AND HIGH ENERGY ION IMPLANTATION

BACKGROUND

The present subject matter relates to a method of fabricating an integrated circuit device. More particularly, the present subject matter presents a method of stripping photoresist after high dose and high energy ion implantation during the fabrication process. However, the method is also useful for stripping photoresist after other processes that alter the composition of the photoresist.

Photoresist is a key component of the process by which integrated circuits in semiconductor devices are fabricated. A photoresist solution is typically coated on a substrate, baked to form a film, patternwise exposed, and developed in aqueous base such as 0.26 Nt-butyl ammonium hydroxide in water to form a pattern in the film. Film thickness is usually in the range of 0.2 to 2 microns but may be thinner or thicker depending on the application. The photoresist can be positive tone in which the exposed area becomes soluble in the developer while the unexposed portion remains insoluble or negative tone where the exposed portion becomes crosslinked or is otherwise made to be insoluble in the developer while the unexposed portion dissolves and is removed. In either case, the photoresist film typically comprises a polymer or resin, a photoactive compound, additives such as surfactants to improve film coating properties or performance, and a trace amount of solvent. For exposure wavelengths which are below 230 nm, one skilled in the art will appreciate that the polymer structure will be modified by removing aromatic groups in order to keep optical absorbance at a reasonable level, typically <1 per micron film thickness. Other types of radiation such as electron beam, ion beam or X-ray may be used to pattern the film.

An antireflective coating (ARC) may be applied on the substrate prior to coating the photoresist. The ARC prevents the imaging radiation from reflecting off the substrate and exposing the photoresist a second time and thereby controls the intensity of the radiation which exposes the photoresist. Once the photoresist film is imaged, the pattern may be transferred into an underlying layer by means of a selective dry etch process where the photoresist serves as a mask for the etching step. If an antireflective layer is present, one etch step is used to etch through the ARC and a second step is needed to transfer the pattern into the underlying substrate. The reactive ions in the dry (plasma) etch step can transform the photoresist film to render it less soluble insolvents or more difficult to remove by an ashing method.

The photoresist must be removed or stripped before subsequent processing steps to avoid any contamination of the device which would cause reduced performance. Typically, the process of photoresist coating and imaging followed by dry etching, ion implantation or a deposition step, and then stripping the photoresist is repeated several times in order to build several layers required for the device.

The photoresist is selected from a group of imaging materials consisting of single layer, bilayer, multilayer, or surface imaging materials. A bilayer or multilayer imaging system typically has a photoresist in the top layer which contains silicon and a lower layer or layers that are not photosensitive. After the top layer is exposed and developed to form a pattern, it serves as an excellent etch mask for image transfer using oxygen plasma into the lower layer or layers. In the presence of oxygen plasma, the silicon materials form silicon dioxide which dramatically slows down the etch loss of the top layer. The lower layer is usually thicker than the top photoresist layer in a bilayer system and serves as an etch mask for image transfer into an underlying substrate.

Silicon containing resists are often difficult to strip because the top layer is covered with a layer of silicon dioxide after the etch transfer step and silicon dioxide is only removed very slowly in oxygen plasma. An alternative to traditional photoresist processing in which the film is developed in aqueous base solution is top surface imaging (TSI). In a TSI process, the photoresist film is usually very opaque to the imaging radiation such that the incident radiation penetrates only part way into the film. The film is then treated with a vapor containing a silicon compound at various temperatures and pressures to selectively form Si—O bonds in either the exposed or unexposed portions of the film. Rather than develop the pattern in aqueous base solution, the film is dry etched in plasma to selectively remove film in regions without any silicon content.

A photoresist pattern can also function as a mask for ion implant steps in which ions of phosphorus, arsenic, or boron are implanted at high energy into an underlying layer. Again, the high energy process can transform the resist film, especially the top portion of the film, such that it becomes difficult to strip. Both wet and dry stripping methods are known. Strippers which involve organic solvents often contain amines that can contaminate the air and adversely affect sensitive photo imaging processes in the fab. They are also costly because of disposal requirements.

Another wet stripper is Caro's acid which consists of $H_2SO_4$ and $H_2O_2$. This solution is a strong oxidant and reacts with photoresist materials composed of the elements C, H, N, S, and O to form the corresponding oxides such as $CO_2$ and $H_2O$. However, when the surface of the photoresist film becomes altered during high energy ion bombardment, Caro's acid is no longer an efficient oxidant.

Dry etching in oxygen plasma also reacts with photoresist materials to form oxides such as $CO_2$, $H_2O$ $SO_2$ and $NO_2$. While dry stripping is preferred, a better process is needed in terms of higher throughput. Ion implantation or other processing steps may harden the photoresist film to the extent that several cycles through an etching chamber or two or more different etching steps are required to completely remove the photoresist film. Ion implantation may dehydrate the resin and make the photoresist surface more compact. Ion implantation also tends to make the oxidation reaction at the surface of the film more difficult. A combination of $CF_4$ and $O_2$ in the etching gas may be used to more easily remove the photoresist. However, this technique is likely to have a detrimental effect on the substrate that reduces device performance. Therefore, an improved stripping method is needed that does not damage the device and does not require a lengthy process time including two or more dry etch steps.

A primary objective of semiconductor manufacturing is to minimize costs such that the product is competitive in the marketplace. Improved processes which decrease throughput time are desirable because they reduce cost. These improvements may consist of fewer steps in a process or a shorter amount of time in a processing tool.

U.S. Pat. No. 6,043,004 describes a two step oxygen etch method to strip photoresist that has been impacted by a high dose ion implant process. However, a critical step is to gradually increase the temperature of the wafer from 150° C. to 200° C. which requires a lengthy process time. U.S. Pat. No. 5,811,358 describes a stripping method consisting of three dry etch steps at different temperatures followed by two wet steps. This is a multi-step process that could impact throughput.

U.S. Pat. No. 5,882,489 mentions the use of an ashing step followed by an argon sputtering step to cleanly remove photoresist. This method would require two different etch chambers and thus have an increased equipment cost over a method with only one etching step.

U.S. Pat. Nos. 6,006,764 and 5,731,243 describe methods to remove photoresist from bonding pads.

The present subject matter obviates the deficiencies in the prior art and provides a method for stripping photoresist after the photoresist film has been subjected to a high dose and high energy implant process. The present subject matter also provides a method for stripping photoresist in applications where the photoresist film has a hardened skin or a high molecular weight polymer resulting from a previous processing step.

In one embodiment, the present subject matter presents a method for stripping photoresist during the fabrication of integrated circuits comprising: treating the photoresist film on a wafer by soaking in de-ionized (DI) water, dry etching the wafer with an oxygen plasma to remove the photoresist, immersing the wafer in Caro's acid to remove any residues, and rinsing and drying the wafer. The de-ionized water treatment may be combined with the dry etching in an integrated step or the two steps may be performed separately. In another embodiment, the present subject matter is a method for stripping photoresist during the fabrication of integrated circuits comprising: treating the photoresist film on a wafer by soaking in de-ionized (01) water, immersing the wafer in Caro's acid to remove the photoresist, and rinsing and drying the wafer.

In another embodiment, the present subject matter presents a method for high dosage and high energy ion implantation during the fabrication of integrated circuits comprising: coating a photoresist solution on a substrate and baking to form a film, patternwise exposing the photoresist film to radiation, thereby forming a pattern of exposed regions in the film which is subsequently developed in aqueous base to uncover portions of the substrate, ion implanting with phosphorus, arsenic or boron ions at high energy through the gaps in the photoresist film into the underlying substrate, and stripping the photoresist wherein the film is soaked in DI water followed by treatment with Caro's acid and wherein the DI water soak may be combined with an oxygen etch step in a integrated process.

The present subject matter is particularly useful in that it provides a high throughput, low cost photoresist removal process because of a minimum number of steps and avoids the use of dry etching techniques such as a combination of $CF_4$ and $O_2$ gases that can affect the substrate and reduce the performance of the device.

These and other advantages of the disclosed subject matter will be readily apparent to one skilled in the art to which the disclosure pertains from a perusal of the claims, the appended drawings, and the following detailed description of the preferred embodiments.

DETAILED DESCRIPTION

The present subject matter relates to a method of stripping a photoresist film during the fabrication of an integrated circuit. It is not restricted to applications involving gate structures and may be useful on other device levels.

Figure 1:
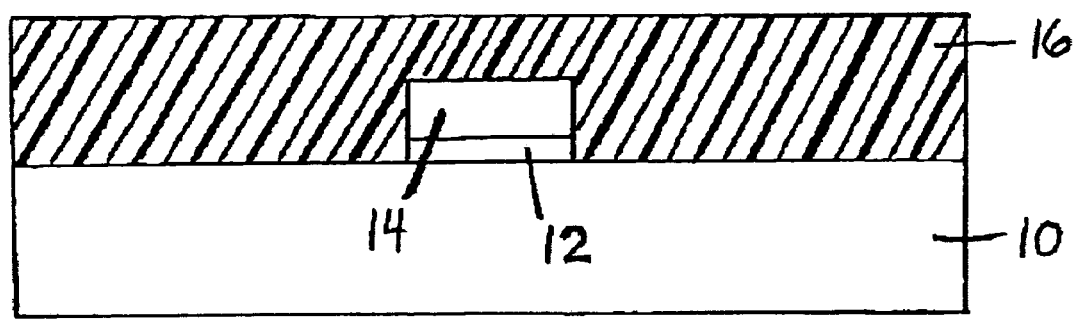
FIG. 1 is a cross sectional drawing of a photoresist coated over a gate structure on a substrate. The photoresist has not been patterned yet.
Figure 2:
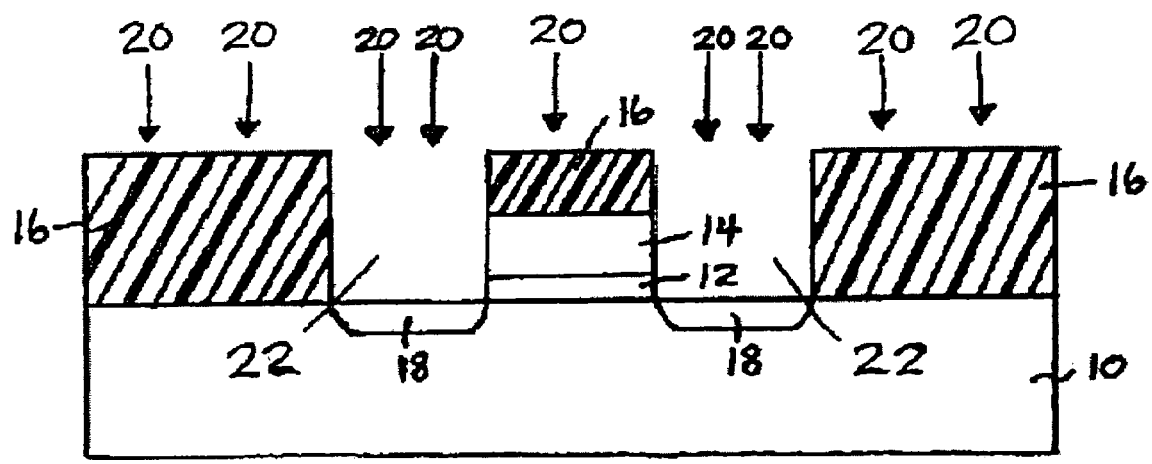
FIG. 2 is a cross sectional drawing depicting ion implantation through the openings of a patterned photoresist film into the underlying substrate.

In one embodiment, the present subject matter is a method of stripping photoresist that has been subjected to a high energy ion and high dose implantation. FIG. 1 is a cross-sectional drawing of a photoresist film 16 that has been coated over a gate structure on a substrate 10. The gate structure is comprised of a gate oxide 12 and a polysilicon layer 14. Referring to FIG. 2, the photoresist film 16 is patternwise exposed and developed in aqueous base to form openings 22 in the film that are adjacent to the gate structure comprised of gate oxide 12 and polysilicon layer 14. Ions 20 of phosphorus, arsenic or boron are implanted through the openings 22 in the photoresist film 16 into regions 18 in the underlying substrate 10. Ions 20 from the implant process also strike the top of the photoresist film 16 and can penetrate to various depths into the film 16 depending upon the ion energy. Energy from the ion impacting the film 16 can alter the composition of the photoresist. The film 16 may become dehydrated, compacted, and less susceptible to subsequent stripping methods involving oxidation or dissolution with solvents.

Figure 3:
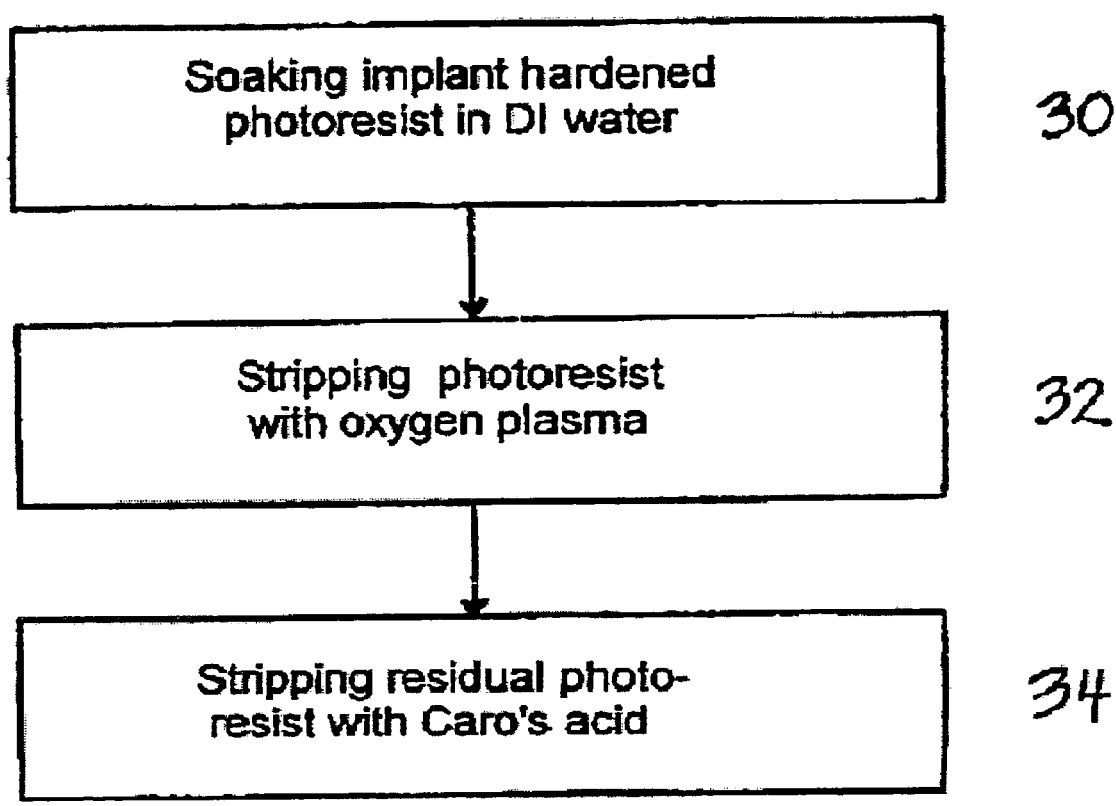
FIG. 3 is flow chart depicting the steps of a stripping a photoresist by using a method of the present subject matter.

FIG. 3 illustrates a stripping process after high dose and high energy ion implantation according to the present subject matter. Referring to FIG. 3, the first step 30 in the stripping process of the present subject matter is to soak the photoresist in DI water to hydrate and soften the film. This step may be carried out by applying water on the wafer in an integrated track process or by immersing a boat of wafers into a container of water for a set amount of time. With wafer immersion, the temperature of the water bath may be increased to promote the ability of the water to swell the film. The amount of time required for the DI water soak with the immersion method may be selected as desired.

For the integrated track process, the method of treatment may be a continuous flow of water over the photoresist film on a wafer or formation of a puddle that is allowed to coat the film for several seconds before being spun off as the wafer is rapidly rotated. In the case of a continuous water flow, the wafer may be slowly rotated so that the water from the nozzle that directs the water flow impacts all areas of the surface evenly. The water flow from the nozzle can be adjusted as desired but advantageously three minutes. Those skilled in the art will also understand that a puddle might be formed on a photoresist film on a wafer in a track process as a substitute for a continuous flow to conserve on the volume of water. In this case, a surfactant may be added to the water to enable it to adhere to the film surface. The preferred temperature range of the water during the soaking process is between 21° C. and 25° C.

The second step 32 in the stripping process flow diagram is to remove the water treated photoresist with oxygen plasma. The second step 32 may be combined with step 30 in an integrated process. In this case, the method consists of the third step 34 is to treat the wafer with Caro's acid solution to remove the remaining photoresist film. The composition of the solution is: $H_2SO_4/H_2O_2$. The wafer is then rinsed with DI water and dried before subsequent process steps.

In another embodiment, the first step 30 of water soaking is followed by Caro's acid treatment 34 and the oxygen plasma step 32 is omitted. In another embodiment, the patterned photoresist layer is not subjected to ion implantation but may have been hardened by another process such as an etch transfer step or a chemical treatment. In this case, all three steps 30, 32, and 34 in the flow diagram (FIG. 3) may be used, or the second step 32 of oxygen plasma etching may be omitted, or step 32 may be combined with step 30 in an integrated process.

Table 1 shows the results of Photoresist Strip after 75 keV Phosphorus Implant for four wafers, two of which are processed according to embodiments of the present subject matter and two processed according to prior art techniques.

The photoresist on the wafers was patternwise exposed and developed to form openings on either side of the gate feature as depicted in FIG. 2. An ion implant tool was used to implant the four wafers in accordance with FIG. 2 with phosphorus ions at an energy of 75 keV and at a dose of 1.3×1016 cm-2 during a determined time period. Two of the wafers were then treated with a continuous flow of water for 3 minutes in an integrated track process. The two other wafers were not treated with water. All four wafers were then etched in an oxygen plasma. One of the wafers that was soaked in DI water and etched was also immersed in a Caro's acid solution consisting of sulfuric acid and hydrogen peroxide. After removing from the Caro's acid solution, the wafer was rinsed with DI water and dried. The wafers that received the water treatment showed a significant improvement in photoresist removal as summarized in Table 1 below. The results were observed using a top-down view of the wafer surface through a microscope.

TABLE 1

Stripping results as a function of process conditions

| Wafer number | Process conditions | Result |
| --- | --- | --- |
| Wafer 1 | Water soak + oxygen etch | No hard skin |
| Wafer 2 | Oxygen etch only | Serious hard skin |
| Wafer 3 | Water soak + oxygen etch + Caro's acid treatment to Clean surface | No photoresist residue |
| Wafer 4 | Oxygen etch + Caro's acid treatment to clean surface | Large areas of photoresist residue |

While this subject matter has been particularly shown and described with reference to, the preferred embodiments thereof, it will be understood by those skilled in the art that various changes in form and details may be made without departing from the spirit and scope of this subject matter.

We claim:

1. A method of stripping a photoresist film wherein the photoresist has a high polymer molecular weight or hardened skin from a previous process step, comprising: soaking the photoresist film coated on a substrate in DI water, and treating the film with a Caro's acid solution followed by rinsing with DI water.

2. The method of claim 1 wherein the DI water treatment is a continuous flow in an integrated track process.

3. The method of claim 2 wherein the time of DI water treatment is approximately 3 minutes.

4. The method of claim 2 wherein the substrate is rotated slowly during the water soaking treatment.

5. The method of claim 1 wherein the water is heated above 25° C.

6. The method of claim 1 wherein a puddle of water that covers the entire surface of the wafer is formed in an integrated track process.

7. The method of claim 6 wherein an surfactant is added to the water to help the puddle adhere to the photoresist surface.

8. The method of claim 1 further comprising the step of an oxygen plasma etch between the water soaking and Caro's acid treatment steps.

9. The method according to claim 8 wherein the water soaking treatment and oxygen plasma etch steps are combined into the same step.

10. The method of claim 1 wherein the previous process is a dry etching or a chemical treatment which altered the composition of the photoresist film.

11. The method of claim 1 wherein the previous process is an ion implantation process.

12. The method of claim 11 in which the ions used in the implantation are selected from the group of $B^{11}$, $P^{31}$, and $As^{75}$.

13. The method of claim 11 wherein the photoresist is a positive or negative tone single layer radiation sensitive material.

14. The method of claim 11 wherein the photoresist is selected from a group comprised of bilayer, multilayer, or top surface imaging materials.

15. A method of fabricating a device comprising:
coating a photoresist on a substrate and baking to form a film,
patternwise exposing the photoresist and developing the wafer in aqueous developer to form a pattern in the film,
ion implantation through the openings in the photoresist pattern into the underlying substrate,
stripping the photoresist with a method comprising the steps of;
(a) soaking in DI water,
(b) immersing the wafer in Caro's acid, followed by a DI water rinse.

16. The method of claim 15 further comprising the step of etching through an optional anti reflective coating located between the substrate and the photoresist, said etching taking place after the patterning of the photoresist and prior to the ion implant.

17. The method of claim 15 further comprising the step of dry etching with an oxygen plasma, said etching taking place between the DI soaking and Caro's acid steps.

18. A method of fabricating a device comprising:
coating a photoresist on a substrate and baking to form a film,
patternwise exposing the photoresist and developing the wafer in aqueous developer to form a pattern in the film,
transferring the photoresist pattern through one or more underlying layers with one or more dry etch steps, and,
stripping the photoresist with a method comprising the steps of;
(a) soaking in DI water,
(b) immersing the wafer in Caro's acid, followed by a DI water rinse and drying.

19. The method of claim 18 further comprising the step of dry etching with oxygen plasma, said etching taking place between the water soaking and Caro's acid steps.

* * * * *